US012585909B2

(12) United States Patent
Kapoor et al.

(10) Patent No.: US 12,585,909 B2
(45) Date of Patent: Mar. 24, 2026

(54) WIRE EMBEDDED LABEL ON SPECIAL SUBSTRATE WITH OR WITHOUT INDUCTIVE COUPLING

(71) Applicants: Puneet Kapoor, Noida (IN); Alok Kapoor, Ghaziabad (IN)

(72) Inventors: Puneet Kapoor, Noida (IN); Alok Kapoor, Ghaziabad (IN)

( * ) Notice: Subject to any disclaimer, the term of this patent is extended or adjusted under 35 U.S.C. 154(b) by 61 days.

(21) Appl. No.: 18/681,621

(22) PCT Filed: Aug. 10, 2022

(86) PCT No.: PCT/IN2022/050719
§ 371 (c)(1),
(2) Date: Feb. 6, 2024

(87) PCT Pub. No.: WO2023/017538
PCT Pub. Date: Feb. 16, 2023

(65) Prior Publication Data
US 2025/0272531 A1 Aug. 28, 2025

(30) Foreign Application Priority Data

Aug. 12, 2021 (IN) ............................. 202111031283
May 31, 2022 (IN) ............................. 202211031289

(51) Int. Cl.
*G06K 19/06* (2006.01)
*G06K 19/077* (2006.01)
*H05K 1/02* (2006.01)

(52) U.S. Cl.
CPC . *G06K 19/07722* (2013.01); *G06K 19/07773* (2013.01); *H05K 1/0243* (2013.01); *H05K 2201/10098* (2013.01)

(58) Field of Classification Search
CPC ....... G06K 19/07722; G06K 19/07773; G06K 19/07749; G06K 19/0723; G06K 19/07; G06K 19/07745; G06K 19/0773; H05K 1/0393; H05K 1/0243
USPC ........................................... 235/492
See application file for complete search history.

(56) References Cited

U.S. PATENT DOCUMENTS

| | | | | |
|---|---|---|---|---|
| 8,022,829 B2 * | 9/2011 | Takeda | ............. | G06K 19/07749 |
| | | | | 340/572.7 |
| 8,973,931 B2 * | 3/2015 | Branger | ................. | B60G 7/005 |
| | | | | 280/124.13 |
| 2004/0094949 A1 * | 5/2004 | Savagian | ......... | G06K 19/07749 |
| | | | | 283/81 |
| 2009/0033495 A1 | 2/2009 | Abraham et al. | | |

(Continued)

FOREIGN PATENT DOCUMENTS

| | | | | | |
|---|---|---|---|---|---|
| CN | 101286206 | * | 6/2011 | ....... | G06K 19/07767 |
| CN | 213276713 U | | 5/2021 | | |
| JP | 2014109842 | * | 6/2014 | ............. | G06K 19/00 |

*Primary Examiner* — Daniel St Cyr
(74) *Attorney, Agent, or Firm* — D'Ambrosio & Menon, PLLC; Usha Menon

(57) ABSTRACT

In accordance with the embodiments of this disclosure, an RFID label or tag (201, 202, 203, 204) is disclosed. The RFID label or tag (201, 202, 203, 204) includes one or more layers of substrate (1), one or more integrated circuits (2), and one or more antennas (3,3A). Herein, the one or more integrated circuits (2) and the one or more antennas (3,3A) are embedded on the one or more layers of substrate (1).

12 Claims, 10 Drawing Sheets

(56) References Cited

U.S. PATENT DOCUMENTS

| | | | |
|---|---|---|---|
| 2010/0090833 A1* | 4/2010 | Mullis ............. | G06K 19/07783 |
| | | | 340/572.8 |
| 2011/0000970 A1* | 1/2011 | Abraham ......... | G06K 19/07749 |
| | | | 235/492 |
| 2013/0270348 A1* | 10/2013 | Zenz ...................... | H01L 21/56 |
| | | | 156/306.6 |

* cited by examiner

201

202

203

204

A                                    B                    C

A                 B               C

A

B

RFID Label (UHF)     RFID Label (HF)     RFID Label (LF)

RFID Label
(Hybrid LF +HF)

RFID Label
(Hybrid HF + UHF)

RFID Label
(Hybrid LF + HF + UHF)

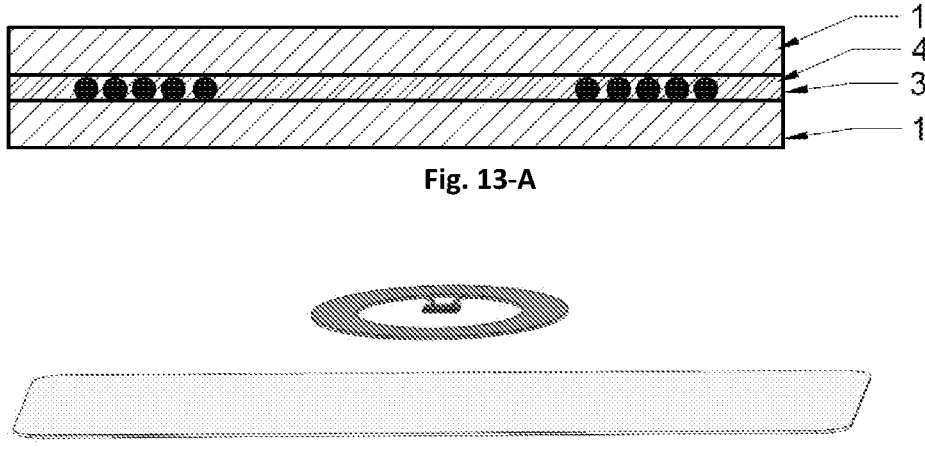
Fig. 13-A
Fig. 13-B

WIRE EMBEDDED LABEL ON SPECIAL SUBSTRATE WITH OR WITHOUT INDUCTIVE COUPLING

FIELD OF THE INVENTION

The present invention relates to an In-Mould RFID Label or tag including one or more integrated RFID circuits with one or more conductive wire antennas embedded either on a special substrate or in combination of the special substrate with other substrates, which is compatible for In-Mould process. More specifically, the present invention relates to a technology method of producing an RFID enabled Label or tag comprising two or more inductively coupled antennas embedded either on a special substrate or in combination of the special substrate with other substrates for enhanced performance and reliability as well as being well-suited for the In-Mould process.

BACKGROUND OF THE INVENTION

Radio Frequency Identification (RFID) is a technology that utilizes radio waves for data collection and transfer. An RFID Tag is generally made of three different components: an RFID chip, which is an integrated circuit (IC), an antenna, and a substrate which can be further packaged in several different ways, depending on the specific RFID application requirements. For instance, the chip and antenna may be mounted on the substrate, or sandwiched between an adhesive layer and a paper label to create smart RFID labels.

The antenna is the largest part of the tag and is connected to the IC. The antenna receives the signals from an interrogator. Depending on the tag type, it either transmits or reflects the received signal. The antenna is usually designed and made by a tag manufacturer and efficient antennas are crucial for long reading distances. Antennas are usually made of thin metal strips of copper, aluminum, or silver. These strips are usually deposited on polyester/PET.

Polyethylene terephthalate (PET) is not compatible with the majority of thermoplastics and cannot be used as an In-Mould label. Some In-Mould labels with etched printing have also been developed by using special techniques to make antennas on other compatible substrates such as Biaxially oriented polypropylene (BOPP) or by sandwiching the polyester label in substrates that are suitable for In-Mould labelling. Etched/Printed antennas are less durable and need special protection for the In-Mould Labeling (IML) process. These techniques result in higher cost and limited compatibility with thermoplastics.

Therefore, there exists a need to overcome the challenges associated with the conventional approaches.

OBJECT OF THE INVENTION

To overcome the above-described challenges, the present invention proposes a special technology where one or more conductive wire antennas may be embedded on a special substrate or on a combination of substrates. This results in a low cost, highly durable, and compatible RFID Label for IML, which can be used with various thermoplastics.

This special substrate or substrate combination can also be used for printed or etched antenna for some applications where wired antennas are not desired. Moreover, the said RFID Label of the present invention can work with Low Frequency (LF), High Frequency (HF), Ultra-high Frequency (UHF) and Hybrid (combination of LF, HF & UHF) technologies.

Therefore, an object of the present invention is to provide an RFID Label or tag comprising one or more conductive wire antennas embedded on a special substrate or substrate combination for, but not limited to, a plastic material product which is attachable directly to various thermoplastic products through an In-Mould process without using any adhesive.

Another object of the present invention is to provide an RFID label or tag consisting of one or more conductive wire antennas embedded by ultrasonic, thermal or other process on the special substrate.

Another object of the present invention is to provide an RFID label or tag comprising one or more conductive wire antennas embedded on special substrate or substrate combination for thermoplastic material product where microporous, dimensionally stable, highly filled, single-layer, polyolefin-based synthetic material (including all grades) is used as the special substrate for RFID IML. This offers greater bonding to the thermoplastic, adaptability, tear resistance and UV light stability compared to other materials and gives optimum protection to the RFID circuit during the In-Mould process and thereafter.

Another object of the present invention is to provide an RFID label or tag comprising one or more conductive wire antennas embedded on a special substrate or substrate combination for a plastic material product which is resistant to high temperature, chemicals and capable of enduring high pressure in the In-Moulding process and afterward.

Another object of the present invention is to provide an RFID label or tag for a plastic material product comprising one or more conductive wire antennas embedded on a special substrate or substrate combination that is not susceptible to disconnection and performs data communication without any problems even after the In-Mould process.

Another object of the present invention is to provide an RFID Label or tag comprising one or more conductive wire antennas embedded on a special substrate or substrate combination for, but not limited to, a plastic material product which is easily attachable to various thermoplastic material products.

Another object of the present invention is to provide an RFID label or tag comprising one or more conductive wire antennas embedded on the special substrate or substrate combination for a plastic material product, wherein the tag or label is in between plastic walls of the product and thus is exceptionally durable and has enhanced performance.

Another object of the present invention is to provide an RFID label or tag comprising one or more conductive wire antennas embedded on a special substrate or substrate combination for a plastic material product which is capable of reducing costs for In-Mould Labelling and improving mass productivity.

Another object of the present invention is to provide an RFID label or tag comprising two or more etched/printed/conductive wire inductively coupled antennas with a special substrate or substrate combination for special UHF applications.

SUMMARY OF THE INVENTION

Embodiments of a wire embedded label or tag (including In-Mould Label) on a special substrate without inductive coupling for LF, HF, UHF and Hybrid Type and a corresponding system are disclosed that address at least some of the above-mentioned challenges and issues.

Embodiments of RFID Label or tag (including In-Mould Label) for UHF comprises an integrated RFID circuit with two or more inductively coupled antennas. The primary and secondary antennas can be one of printed/etched/conductive wire embedded antennas or a combination thereof on a special substrate or substrate combination.

In accordance with the embodiments of this disclosure, an RFID label or tag is disclosed. The RFID label or tag includes one or more layers of substrate, one or more integrated circuits, and one or more antennas. Herein, the integrated circuits and the antennas are embedded on the one or more layers of substrate.

In accordance with the embodiments of this disclosure, a method for manufacturing the RFID label or tag is disclosed. The method includes providing one or more layers of substrate. The method further includes embedding one or more antennas and one or more integrated circuits on the one or more layers of substrate.

BRIEF DESCRIPTION OF THE DRAWINGS

Further advantages of the invention will become apparent by reference to the detailed description of preferred embodiments when considered in conjunction with the drawings:

FIGS. 13A and 13B illustrate perspective views of the said RFID Label or tag manufactured by air coil for UHF, LF & HF.

DETAILED DESCRIPTION

The following detailed description is presented to enable any person skilled in the art to make and use the invention.

For purposes of explanation, specific details are set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown but is to be accorded the widest possible scope consistent with the principles and features disclosed herein.

The various embodiments throughout the disclosure will be explained in more detail with reference to figures.

Figure 1:
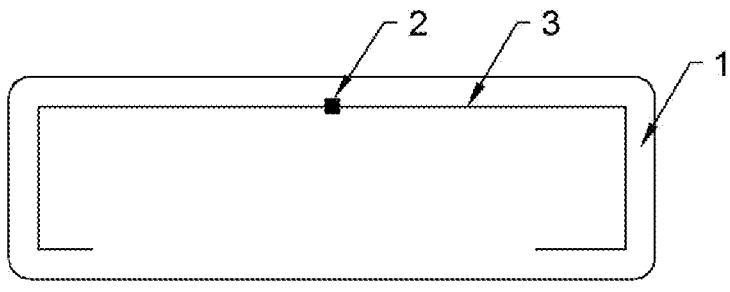
FIG. 1 is a perspective view of the said RFID Label or tag without inductive coupling.

FIG. 1 is a perspective view RFID Label or Tag where antenna (3) can be air coil, embedded conductive wire, etched or printed antenna depending on applications, integrated RFID circuit (2) and special substrate (1) or combination of other substrates.

Figure 2:
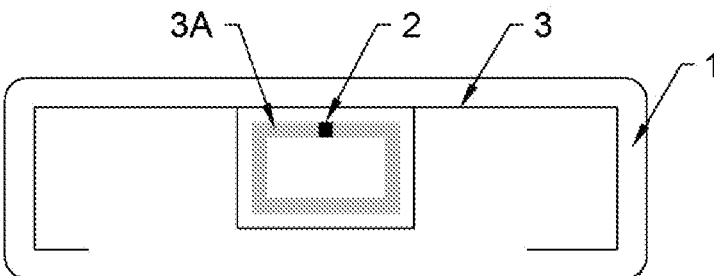
FIG. 2 is a perspective view of the said RFID Label or tag with inductive coupling.

FIG. 2 illustrates a configuration of RFID Label or Tag containing an integrated RFID circuit with two or more inductively coupled antennas. The primary antenna (3A) and secondary antenna (3) can be one of printed/etched/conductive wire embedded antenna or a combination thereof on a special substrate (1) or a combination of other substrates.

FIGS. 3A-3D illustrate various configurations of the RFID label or tag, according to various embodiments presented herein.

Figure 3A:
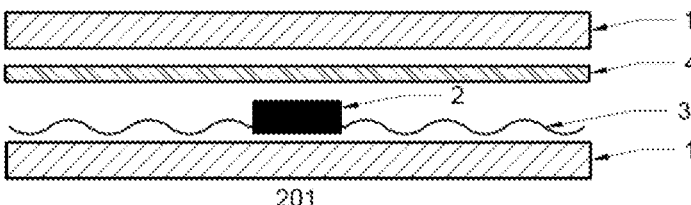
FIGS. 3A-3D illustrate various configurations of the RFID label or tag, according to an embodiment.

FIG. 3A illustrates another configuration of the RFID label (201) with an additional layer of substrate and a protecting layer (4, also called protective overlay). In an embodiment, the protective layer (4) may generally be a laminating film/glue layer to provide additional protection to the integrated RFID circuit (2) and conductive wire antenna (3). The other layer of the substrate may be to provide a smooth printing surface, durability, and stability under various conditions, dissipation of static buildup, and mechanical protection for the components and their interconnections. In an embodiment, the other layer of the substrate or the protective overlay (4) is also suitable for laser printing which is scratch proof and permanent and can be carried out even after the RFID Label is molded or manufactured. The advantage of this aspect is that many companies wish to print and program after the label is already molded or manufactured, and laser printing is the only option that can be done afterwards and is permanent.

Figure 3B:
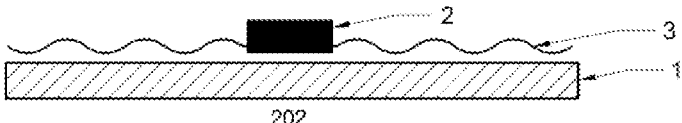

FIG. 3B illustrates another configuration of the RFID label (202) that includes a layer of the substrate (1), an RFID integrated circuit (2) with an antenna (3) embedded on the substrate (1).

Figure 3C:
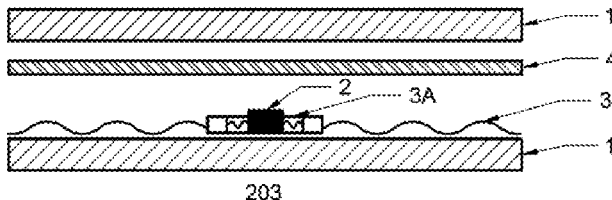

FIG. 3C illustrates yet another configuration of the RFID label (203) that includes two layers of the substrate (1), an integrated RFID circuit (2) with antennas (3, 3A) embedded on the substrate (1). In this embodiment, the inductively coupled wire antennas include a primary antenna (3A) and a secondary antenna (3). This configuration may also include the protective layer (4) for additional mechanical protection of the antennas (3, 3A) and the RFID integrated circuit (2).

Figure 3D:
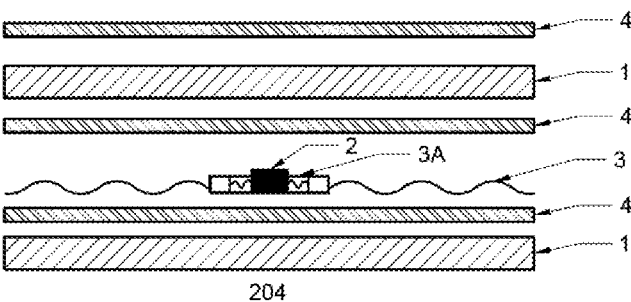

FIG. 3D illustrates yet another configuration of the RFID label (204), which includes a multi-layer RFID label or tag (204). This configuration includes two layers of the substrate (1), an integrated RFID circuit (2) with conductive wire antennas (3, 3A) embedded on the substrate (1), in the manner illustrated in FIG. 3D. This configuration may further include multiple protective layers (4) for additional mechanical protection of the antennas (3, 3A) and the RFID integrated circuit (2), and the topmost protective layer can be compatible with laser printing.

Figure 4:
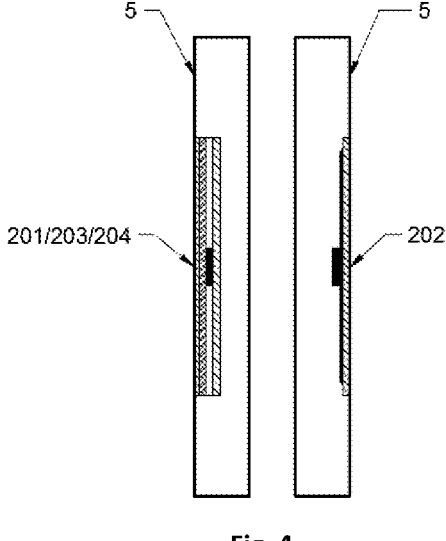
FIG. 4 is a sectional view of a flat surface container (5) having all (201, 202, 203, 204) types of RFID Label or tag attached to a side wall

FIG. 4 is a sectional view of a flat surface container having different types of RFID Labels or tags attached to a side wall of the flat surface container. For instance, FIG. 4 illustrates a single-layer RFID label or tag (202) attached to the flat surface container (5) and a multi-layer RFID label or tag (201, 203, 204) attached to the flat surface container.

Figure 5:
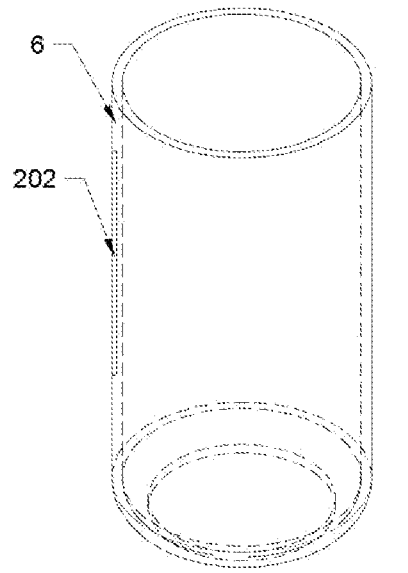
FIG. 5 is a sectional view of a curved surface container (6) having the said RFID Label or tag attached to a side wall, according to an embodiment.

FIG. 5 is a sectional view of a curved surface container (6) having the said RFID Label or tag attached to a side wall. The embodiments described above in the context of FIGS. 3A-3D are also applicable to this embodiment.

Figure 6:
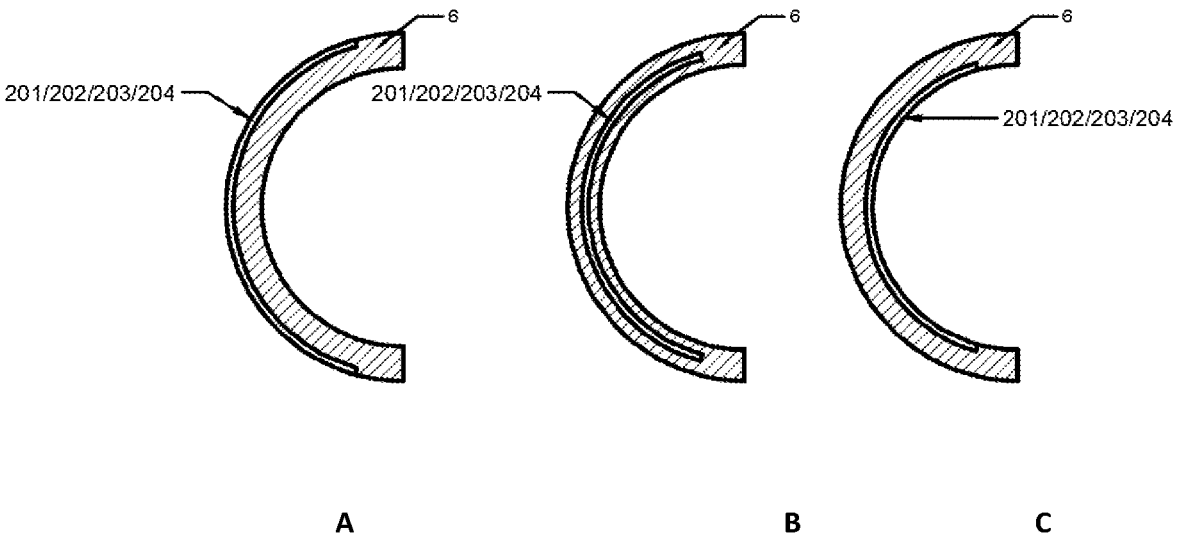
FIG. 6 is a sectional view of a curved surface container (6) having the said RFID Label or tag attached to the inner surface (FIG. 6C), outer surface (FIG. 6A) and in between the side walls (FIG. 6B).

FIG. 6 is a sectional view of a curved surface container (6) having the said RFID Label or tag attached to various portions of the curved surface container (6). For instance, FIG. 6A illustrates the RFID label or tag (201, 202, 203, 204) attached to the outer surface of the curved surface container (6), FIG. 6B illustrates the RFID label or tag (201, 202, 203, 204) attached in between the side walls of the curved surface container (6), and FIG. 6C illustrates the RFID label or tag (201, 202, 203, 204) attached to the outer surface of the curved surface container (6).

Figure 7:
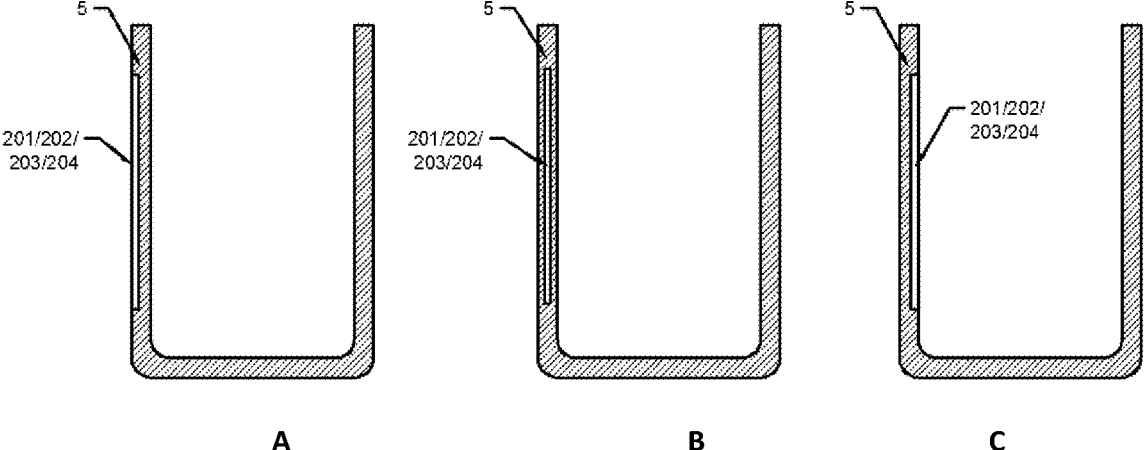
FIG. 7 is a sectional view of a flat surface container having the said RFID Label or tag attached to the outer surface (FIG. 7A), inner surface (FIG. 7C) and in between the side walls (FIG. 7B), according to an embodiment.

FIGS. 7A-7C illustrate a sectional view of a flat surface container (5) having the In-Mould RFID Label or tag (201, 202, 203, 204) attached to it. In one example, the flat surface container (5) may be made of thermoplastic.

FIG. 7A illustrates the RFID Label or tag (201, 202, 203, 204) attached on an outer surface of a flat surface plastic container (5). FIG. 7C illustrates the RFID Label or tag (201, 202, 203, 204) attached on an inside wall of the flat surface container (5). FIG. 7B illustrates the RFID Label or tag (201, 202, 203, 204) attached in between the side walls of the flat surface container (5).

Figure 8:
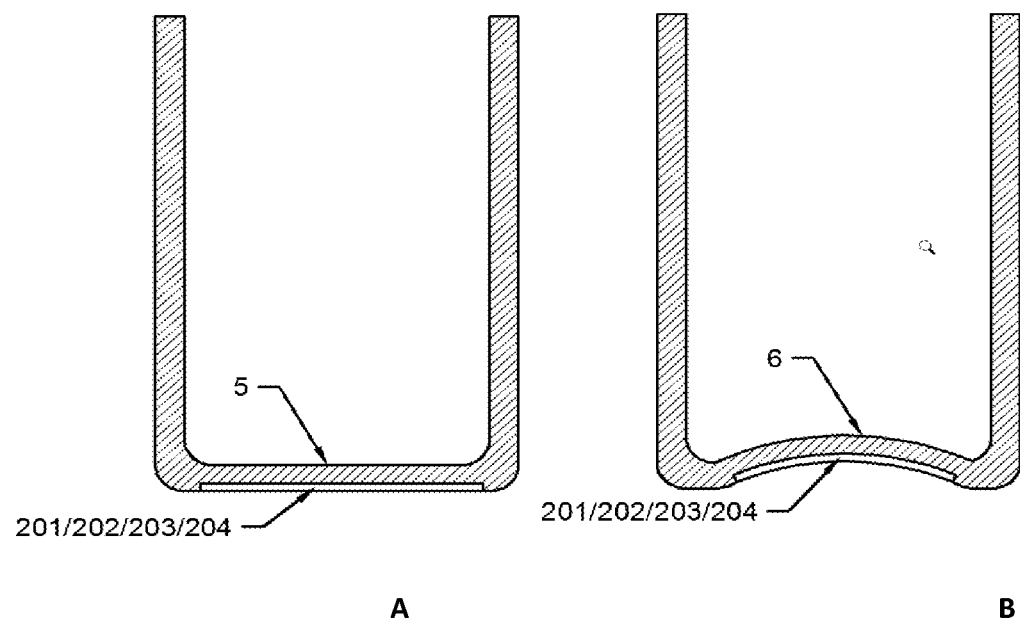
FIG. 8 is a sectional view of a flat surface container (5) and curved surface container (6) having the said RFID Label or tag attached to the bottom of container.

FIG. 8A illustrates a sectional view of a flat surface container (5) having the said RFID Label or tag attached to the bottom of the container (5). FIG. 8B illustrates a sectional view of a curved surface container (6) having the said RFID Label or tag attached to the bottom of container (6).

Figure 9:
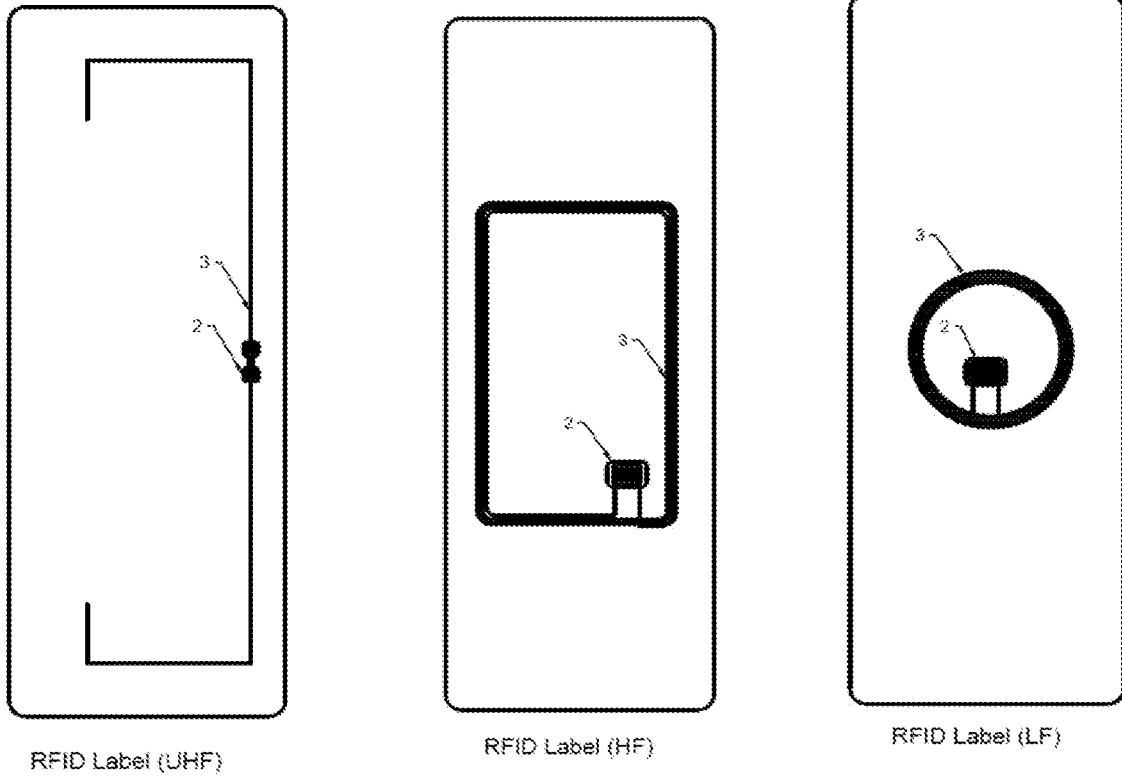
FIG. 9 is a perspective view of the said RFID Label or tag manufactured using different frequencies like: LF, HF and/or UHF.

FIG. 9 is a perspective view of the said RFID Label or tag manufactured using different frequencies like: LF, HF and/or UHF.

Figure 10:
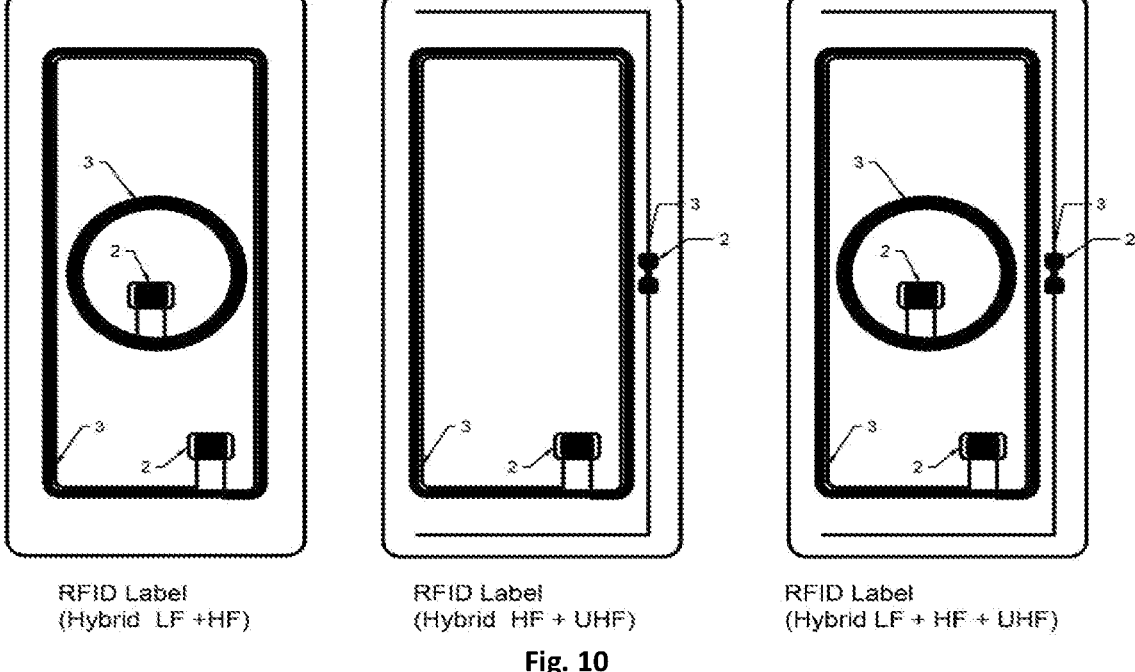
FIG. 10 is a perspective view of the said RFID Label or tag manufactured using Hybrid technology in which two or more frequencies are combined together.

FIG. 10 is a perspective view of the said RFID Label or tag manufactured using Hybrid technology in which we combine two or more frequencies together.

Figure 11:
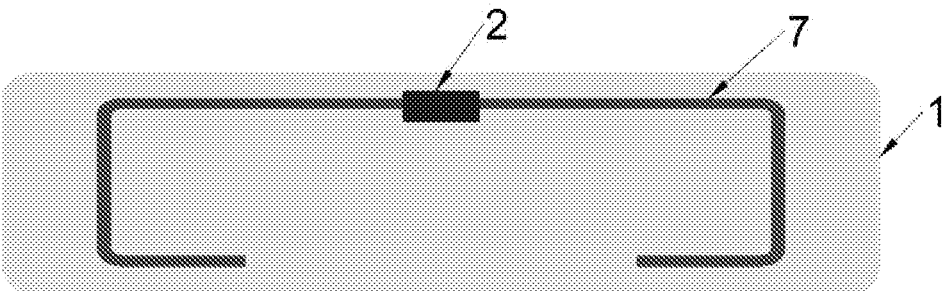
FIG. 11 is a perspective view of the said RFID Label or tag manufactured using an etched or a printed antenna on special substrate (1).

FIG. 11 is a perspective view of the said RFID Label or tag manufactured using etched or printed antenna on special substrate (1).

Figures 12A, 12B:
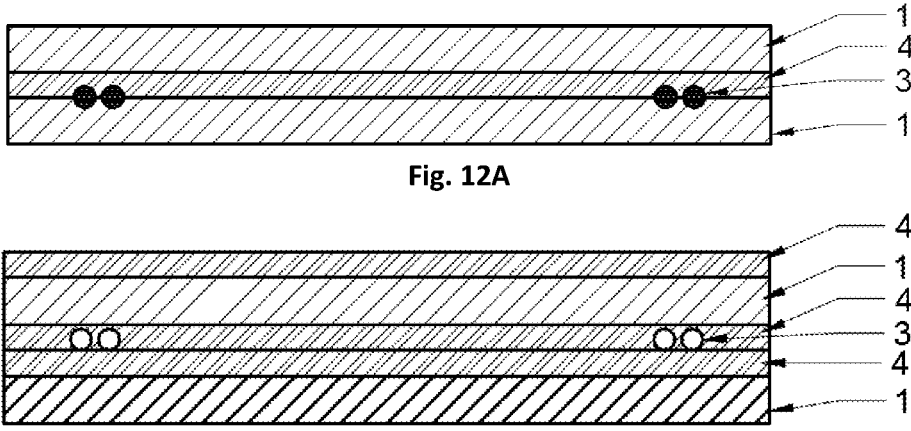
FIGS. 12A and 12B are perspective views of the said RFID Label or tag manufactured by wire embedded by ultrasonic, thermal or other process on substrate for UHF & HF.

FIG. 12 (A,B) is a perspective view of the said RFID Label or tag manufactured by wire embedded by ultrasonic, thermal or other process on substrate for UHF & HF.

FIG. 13 (A,B) is a perspective view of the said RFID Label or tag manufactured by air coil for UHF, LF & HF.

RFID labels are conventionally attached to plastic products like bins, crates, boxes or any other items with the help of glue or adhesive. Since they are glued, there is an additional process of gluing and labelling. Labelling itself is an extra process which may cause some difficulty in mass production with an increase in rejection ratio.

Further, putting the label with glue/adhesive adds thickness to the product and there is a chance of moisture and dust getting in between the plastic and the RFID label. These labels are used on various plastic products which are used in the food/beverages industry, pharmaceutical industry, medical industry, cosmetics industry and other industries where contamination is a sensitive issue. Because of this issue, plastic products go through multiple washing and chemical cleaning cycles which are often not effective in decontaminating the product. Moreover the adhesive labels may not withstand the cleaning processes.

To overcome the above problems the RFID label or tag can be co-moulded along with the plastic product to seamlessly and permanently attach it to the plastic. An RFID label or tag according to the embodiments presented herein, is fixed to the plastic and no contamination can occur between the plastic and the label.

An RFID IML should have the Following Characteristics:

I. Excellent fusion with various thermoplastics
 II. Resistant to extreme temperature at the time of moulding
 III. Capable to endure high pressure of moulding process
 IV. High electrical performance
 V. Exceptionally durable
 VI. Survive extreme conditions along with the life cycle of the product
 VII. Resistant to industrial washing/cleaning process
 VIII. Waterproof
 IX. Recyclable
 X. Suitable for thin and thick wall applications
 XI. Cost effective
 XII. High-quality and durable printing
 XIII. Absence of blisters/bubbles during IML
 XIV. Capable of incorporation in flat, curved, circular and other shapes
 XV. No or minimal change in existing product design
 XVI. No or minimal change in existing product material
 XVII. Printable compatibility with a wide range of print processes, including inkjet, laser and thermal transfer for on-demand and variable data printing.

Below are Some Advantages of Conductive Wire Antenna Over Printed Antenna

| Serial No. | Printed Antenna RFID Label | Wire Antenna RFID Label |
|---|---|---|
| 1. | Limited conductivity | More conductivity in comparison to printed antenna |
| 2. | Using Silver as conductive ink is expensive | Less expensive in comparison to silver |
| 3. | Limitation in the form of a minimum line width with printed RFID antenna | No limitation of minimum line width |

As disclosed in the above-described embodiments, the present invention relates to a RFID Label (including In-Mould Label) or Tag including an integrated RFID circuit (2) with two or more inductively coupled antennas (3, 3A) embedded on a special substrate (1) or substrate combination. This arrangement offers greater bonding to thermoplastic, adaptability, tear resistance and UV light stability compared to other materials which are commonly used for IML. The said substrate (1) is tested to survive high temperatures for extended time periods, making it well-suited for In-Mould process and giving optimum protection to the RFID circuit during In-Mould process and thereafter. The said RFID Label or Tag (201, 202, 203, 204) can be incorporated anywhere on the inner wall, outer wall, in between the plastic walls, or on the bottom of the plastic by IML, over molding or a combination of both.

In another aspect, a technology method of making a well suited RFID Label (including In-Mould Label) or Tag (203, 204) including an integrated RFID circuit (2) with inductively coupled antennas (3, 3A) made by using either one or combination of printed/etched/conductive wire, embedded on special substrate (1) or substrate combination, is disclosed.

The primary objective of producing this In-Mould RFID Label is to overcome the deprivation of currently manufactured printed RFID Label for In-Mould process. The presented embodiments propose using copper, aluminum or any conductive wire antenna which is embedded on special substrate (1) or substrate combination for enhanced performance and reliability in comparison to printed antenna. The said RFID Label is placed on the wall of mould cavity at the time of manufacturing, thus intended to be an integral part of the final plastic product and tamper resistant. The specially designed In-Mould RFID Label can give an enhanced performance as well as a reliable, lifelong attachment to the plastic product.

The said special substrate (or combination) is a microporous, dimensionally stable, highly filled, single-layer, polyolefin-based synthetic material. A non-abrasive inorganic filler comprises 60 percent of the weight, and it is 65 percent air by volume. The porous, uncoated nature of said special substrate (1) or substrate combination absorbs inks, adhesives, coatings and laminates into its structure to form strong, interlocking bonds with the substrate. It offers greater stiffness, tear resistance and UV light stability than other product grades. Tested to survive high temperatures for extended time periods, making it suitable for in-mould applications. The manufactured In-Mould RFID labels based on this said substrate (1) are highly durable, tough and chemically resistant due to its two main components of polyolefin and silica. It looks, prints and fabricates like paper, but is durable like plastic film. The porous nature makes this said substrate (1) highly absorptive, enabling inks to set almost instantly, resulting in rich, vibrant color and crisp, clear print definition.

Further, this substrate (1) exhibits a lower dielectric constant than other polymer substrate materials. The interconnected microporous structure inherent in said substrate allows for entangled bonding under heat and pressure without adhesives to a wide variety of polymers and resins.

The substrate (1) proposed herein is adaptable to a wide variety of moulding systems including, but not limited to:
   I. Injection moulding
   II. Blow moulding
   III. Rotational (or rotary) moulding
   IV. Thermoforming (match metal die, vacuum forming, pressure forming, plug-assist forming)

Its microporous structure provides breathability which helps prevent blisters/bubbles during moulding and allows superior bonds to be formed without adhesives to polymers/substrates such as:
   I. Polyvinyl chloride (PVC)
   II. Polyethylene (PE)
   III. Polycarbonate (PC)
   IV. Polyamide
   V. Polyethylene terephthalate (PET)
   VI. Polypropylene (PP)
   VII. High density polyethylene (HDPE)
   VIII. Thermoplastic olefin (TPO)
   IX. Acrylonitrile butadiene (ABS)
   X. Polyethylene Terephthalate Glycol (PETG)
   XI. Biaxially Oriented PolyPropylene Films (BOPP)
   XII. Fiberglass
   XIII. Sheet moulding compound (SMC)
   XIV. Foam/solid rubber
   XV. Polyurethane foam
   XVI. Various other thermoplastics Design and Manufacturing Process of In-Mould RFID Label The said laminated In-Mould RFID Label or Tag in terms of wire antenna (3) design, integrated circuit (2) and special substrate (1) or substrate combination offers greater bonding to thermoplastic, adaptability, tear resistance and UV light stability compared to other materials which are commonly used for IML. The said substrate (1) is tested to survive high temperatures for extended time periods, making it well-suited for In-Mould process.

To design the said laminated In-Mould RFID Label or Tag (201, 202, 203, 204), the first step is to select the substrate material according to the application. The next step is to design wire antennas where antenna (3) can be air coil, embedded conductive wire, etched or printed antenna depending on applications. Then after designing the antenna, the antenna and the integrated circuit (2) are attached onto the said special substrate (1) or substrate combination with the help of ultrasonic, thermal or other standard process. After the process of making sheet inlay in which the said specially designed antenna (3) is embedded to said substrate (1), the laminated In-Mould RFID label (202) is ready to be attached directly to various thermoplastic products through In-Mould/over mould process.

For producing the said In-Mould label (201), a laminating film/glue/protective layer (4) is added to provide additional protection to RFID integrated circuit and conductive antenna (3). After adding protective overlay, another layer of said substrate (1) is added to provide a smooth printing surface, durability, and stability under various conditions, dissipation of static buildup, and mechanical protection for the components and their interconnections.

In another aspect of the invention, the In-Mould RFID Label (203, 204) contains an integrated RFID circuit with two or more inductively coupled antennas. The primary (3A) and secondary antenna (3) can be made by printed/etched/conductive wire embedded antenna on a special substrate (1) or substrate combination.

A person skilled in the art would understand that the method described above is applicable for all configurations (201, 202, 203, 204) of the RFID label or tag presented herein and the applicability of any step of the method is not limited by any specific embodiment or configuration.

Advantages of the Present Invention
   I. Compatibility with different thermoplastics.
   II. Excellent bonding to various thermoplastics.
   III. No blisters/bubbles at the time of moulding.
   IV. High temperature and pressure resistant.
   V. Eco-friendly and fully recyclable.
   VI. Flexible, thin, compact & light weight.
   VII. Excellent printability.
   VIII. Can be incorporated in very small parts as well as on thin plastic walls.
   IX. High performance in comparison to printed antenna.
   X. High durability: Once applied it cannot be erased or removed.
   XI. Very cost-effective solution.
   XII. Can be fully automated.
   XIII. Minimal human interference.
   XIV. Single step process for both the moulding and RFID labelling of the product. This ensures the security of the pack because it is not possible to remove or replace the RFID label which is permanently bonded to the pack.
   XV. Delivers manufacturing economies and efficiencies without sacrificing the aesthetics of the product packaging or material.

XVI. Enhanced performance: Maximum reading distance can be reached due to conductive wire used as antenna medium which is more conductive in comparison to printed antenna.

XVII. Can be incorporated in flat, curved, circular, other shapes and as well as in between the plastic walls of products.

XVIII. Can be placed either on the inner or outer wall to plastic article.

XIX. Can be placed either on side or bottom of plastic article.

Below are Some Advantages of an Integrated RFID Inductive Coupled Antennas, Having Two or More Antennas:

Inductive coupling-based power transfer has several advantages over other methods. It is immune to environmental factors such as dust, water, or chemicals and can work even after failing of the secondary antenna (3). Inductive coupling transfers electrical power between two isolated coils placed in close proximity to each other. The nearness of the coils plays a vital role in the generation of a low power electric field between them and hence allows the transfer of power from the secondary (3) to the primary (3A) antenna. Following are some of the applications:

I. Smart stock Management.

II. Food and beverage supply chain.

III. Automotive closed loop logistics

IV. For Pallet, Crates, Boxes, Flower Pot and other items used for Track & Trace.

The said RFID Label or Tag (201, 202, 203, 204) is well-suited for use as In-Mould Label and is preferably placed in position on the wall of the mould cavity immediately before moulding takes place. The said Label's flexible design helps it to accurately take the shape of the internal surface of the cavity. It can be incorporated on the inner wall, outer wall, in-between plastic walls or on the bottom of the plastic product (7-A, B, C & FIG. 8) depending on the application, by IML (In-Mould Labelling), without the use of adhesive materials and serves as an integral part of the final product, staying impressively on the product for the duration of its life.

In accordance with the embodiments of this disclosure, the terms "comprising," "including," and "having," as used in the claim and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition, or step being referred to is an optional (not required) feature of the invention.

The present disclosure has been described with reference to various specific and preferred embodiments and techniques. However, it should be understood that many variations and modifications may be made while remaining within the spirit and scope of the invention. It will be apparent to one of ordinary skill in the art that methods, devices, device elements, materials, procedures, and techniques other than those specifically described herein can be applied to the practice of the invention as broadly disclosed herein without resort to undue experimentation. All art-known functional equivalents of methods, devices, device elements, materials, procedures, and techniques described herein are intended to be encompassed by this invention. Whenever a range is disclosed, all subranges and individual values are intended to be encompassed. This invention is not to be limited by the embodiments disclosed, including any shown in the drawings or exemplified in the specification, which are given by way of example and not of limitation.

While the invention has been described with respect to a limited number of embodiments, those skilled in the art, having benefit of this disclosure, will appreciate that other embodiments can be devised which do not depart from the scope of the invention as disclosed herein.

We claim:

1. A radio frequency identification (RFID) label or tag (201, 202, 203, 204) for an article, comprising:
   one or more layers of substrate (1);
   a single integrated circuit (2); and
   a primary antenna (3A) and a secondary antenna (3),
   wherein the primary antenna (3A) is connected to the single integrated circuit (2) and the secondary antenna (3) is inductively coupled to the primary antenna (3A);
   wherein the integrated circuit (2) and the primary and secondary antennas (3, 3A) are embedded on a single layer of substrate (1) among the one or more layers of substrate;
   wherein the secondary antenna (3) is a conductive wire antenna; and
   wherein said RFID label or tag is positioned within the article using in-mould labelling process, or an over mould labelling process facilitated by the integrated circuit (2) and the primary and secondary antennas (3, 3A) being located on the single layer of substrate (1).

2. The RFID label or tag (201, 202, 203, 204) as claimed in claim 1, wherein the substrate comprises one of or a combination of Polyethylene Terephthalate Glycol, Polyvinyl Chloride, Polycarbonate, Teslin, Acrylonitrile butadiene, Polypropylene, Biaxially Oriented PolyPropylene Films, Polyethylene Terephthalate and other thermoplastics.

3. The RFID label or tag (201, 202, 203, 204) as claimed in claim 1, wherein the RFID label or tag (201, 202, 203, 204) is laminated.

4. The RFID label or tag (201, 202, 203, 204) as claimed in claim 1, wherein the substrate (1) comprises a dimensionally stable material.

5. The RFID label or tag (201, 202, 203, 204) as claimed in claim 1, wherein the primary antenna (3A) is any of a conductive wire antenna, an air coil antenna, an etched antenna and a printed antenna.

6. The RFID label or tag (201, 202, 203, 204) as claimed in claim 1, further comprising a protective overlay/glue layer (4) to provide mechanical protection to the integrated circuit (2) and to one or more antennas (3,3A).

7. The RFID label or tag (201, 202, 203, 204) as claimed in claim 6, wherein the protective overlay (4) comprises a laminating film or a glue layer and further wherein, the laminating film comprises one of or a combination of Polyvinyl Chloride, Polyethylene Terephthalate Glycol, Polyurethane, Polycarbonate and other thermoplastics.

8. The RFID label or tag (201, 202, 203, 204) as claimed in claim 6, further comprising an additional layer of the substrate (1) mounted over the protective overlay (4) wherein the additional layer of the substrate (1) is laser printable.

9. The RFID label or tag (201, 202, 203, 204) as claimed in claim 7, wherein the protective overlay (4) is laser printable.

10. A method of manufacturing a Radio Frequency Identification (RFID) label or tag (201, 202, 203, 204) for being positioned within an article using in-mould or over mould labelling process, comprising:

providing one or more layers of substrate (1), a single integrated circuit (2); and a primary antenna (3A) connected to the single integrated circuit (2) and a secondary antenna (3) inductively coupled to the primary antenna (3A); and embedding the primary antenna (3A) and the secondary antenna (3) on a single layer of substrate (1) among the one or more layers of substrate (1) along with the single integrated circuit (2); wherein the in-mould labelling or over mould labelling process is facilitated by the integrated circuit (2) and the primary and secondary antennas (3, 3A) being located on the single layer of substrate (1).

11. The method as claimed in claim 10, further comprising embedding a protective overlay (4) over the integrated circuit (2) and the primary antenna (3A) and the secondary antenna (3).

12. The method as claimed in claim 11, further comprising embedding an additional layer of the substrate (1) over the protective overlay (4).

\* \* \* \* \*